United States Patent
Wagner et al.

(10) Patent No.: US 6,985,029 B2
(45) Date of Patent: Jan. 10, 2006

(54) CIRCUIT CONFIGURATION FOR TOLERANCE CORRECTION IN A FREQUENCY DEMODULATOR

(75) Inventors: Elmar Wagner, Duisburg (DE); Stefan Heinen, Krefeld (DE); Andre Hanke, Düsseldorf (DE)

(73) Assignee: Infineon Technologies AG, Munich (DE)

( * ) Notice: Subject to any disclaimer, the term of this patent is extended or adjusted under 35 U.S.C. 154(b) by 162 days.

(21) Appl. No.: 10/298,832

(22) Filed: Nov. 18, 2002

(65) Prior Publication Data

US 2004/0018825 A1 Jan. 29, 2004

Related U.S. Application Data

(63) Continuation of application No. PCT/DE01/01704, filed on May 4, 2001.

(30) Foreign Application Priority Data

May 16, 2000 (DE) .......................... 100 23 873

(51) Int. Cl.
*H03D 3/00* (2006.01)

(52) U.S. Cl. .................. 329/315; 329/318; 329/319; 329/320; 329/323; 455/266; 375/324; 375/350

(58) Field of Classification Search ............... 329/315, 329/318, 319, 320, 323; 455/266; 375/324, 375/350
See application file for complete search history.

(56) References Cited

U.S. PATENT DOCUMENTS

| 4,410,856 A | 10/1983 | van Zanten ............... 329/319 |
| 6,275,542 B1 * | 8/2001 | Katayama et al. .......... 375/322 |

FOREIGN PATENT DOCUMENTS

| DE | 30 48 104 A1 | 9/1981 |
| DE | 36 13 994 A1 | 10/1987 |
| EP | 0 255 175 A2 | 2/1988 |
| EP | 0 574 083 A1 | 12/1993 |
| EP | 0 948 128 A1 | 10/1999 |
| FR | 2 207 284 | 6/1974 |
| GB | 1 455 832 | 11/1976 |

* cited by examiner

*Primary Examiner*—Arnold Kinkead
(74) *Attorney, Agent, or Firm*—Laurence A. Greenberg; Werner H. Stemer; Ralph E. Locher

(57) ABSTRACT

A demodulator has a resistor and a capacitor that may be subject to tolerances. For tolerance correction, the FM demodulator is preferably supplied with a reference frequency, which corresponds to the nominal mid-frequency of the demodulator, which is a function of the resistor and the capacitor. Any discrepancy between the actual mid-frequency of the demodulator and its nominal mid-frequency leads to the production of a voltage that differs from a nominal voltage at the output. A detector detects this error and adjusts the values of the resistor or capacitor until the error between the nominal voltage and the voltage is zero or is a minimum. The described principle can be used, for example, in integrated mobile radio receivers.

16 Claims, 2 Drawing Sheets

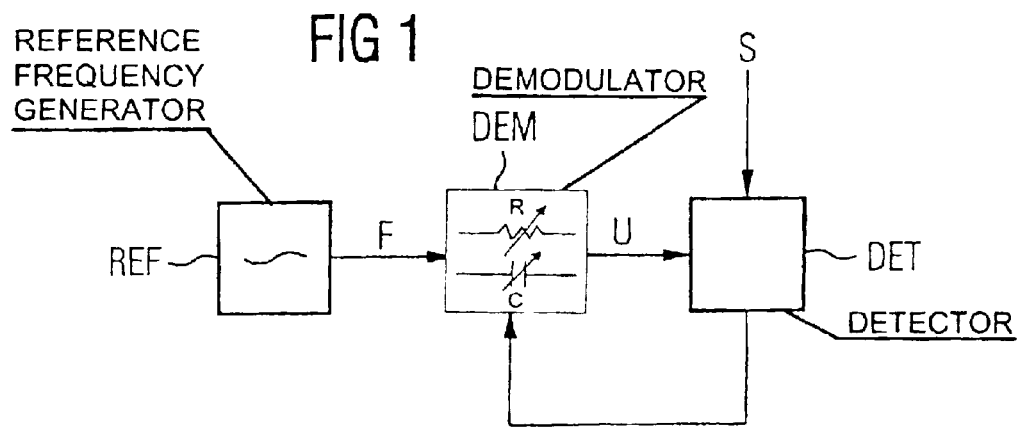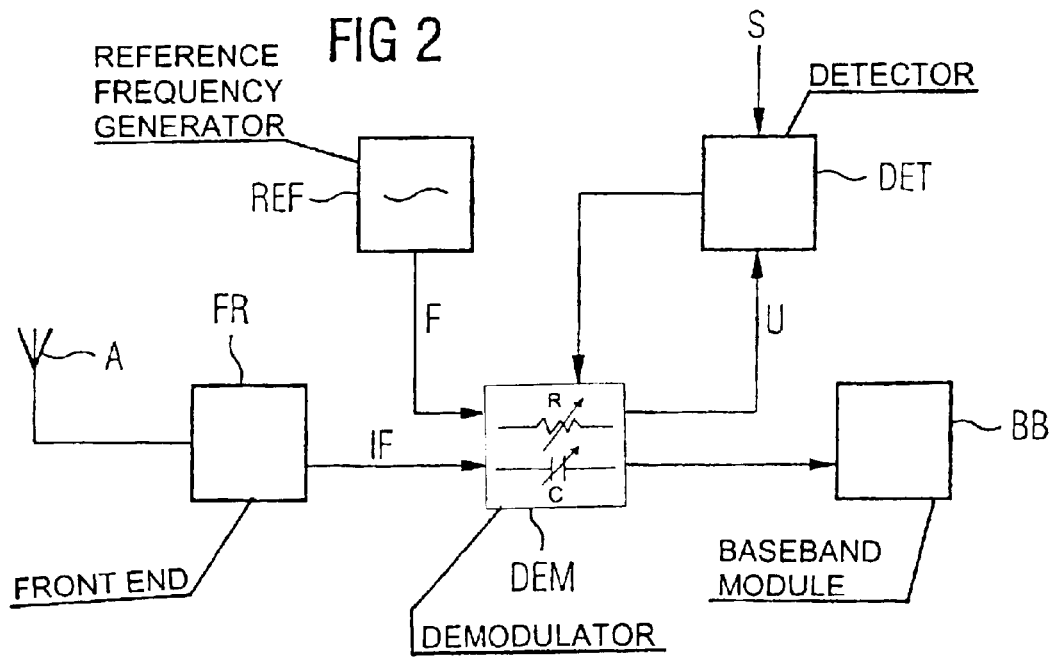

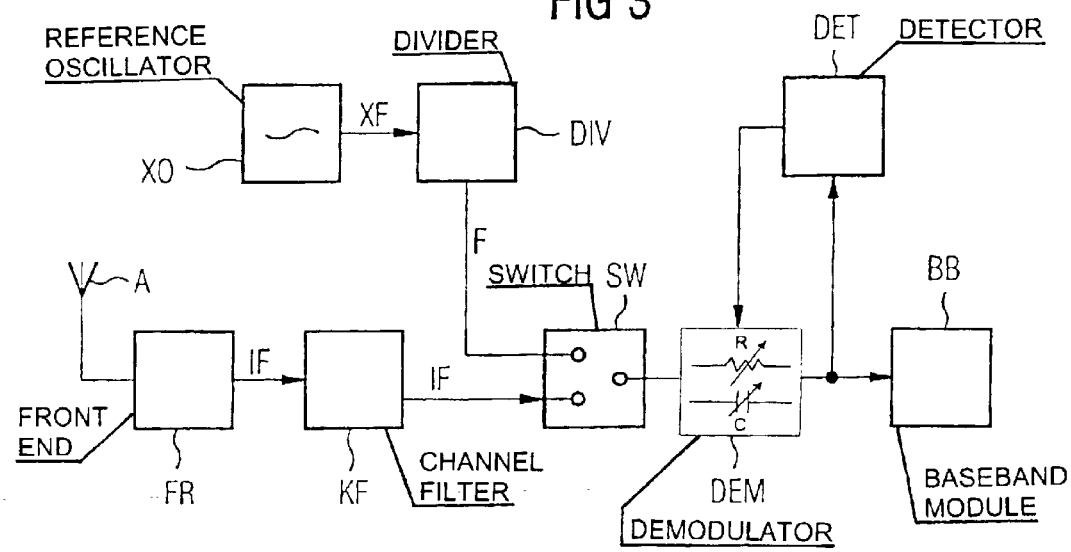
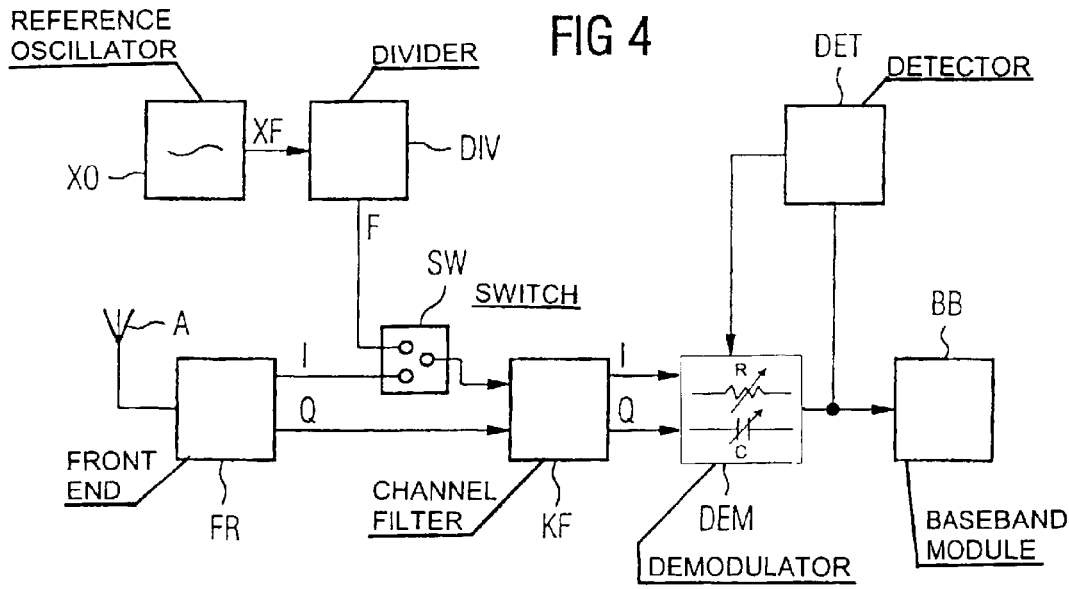

CIRCUIT CONFIGURATION FOR TOLERANCE CORRECTION IN A FREQUENCY DEMODULATOR

CROSS-REFERENCE TO RELATED APPLICATION

This application is a continuation of copending International Application No. PCT/DE01/01704, filed May 4, 2001, which designated the United States and was not published in English.

BACKGROUND OF THE INVENTION

Field of the Invention

The invention relates to a circuit configuration for correcting manufacturing tolerances in a frequency demodulator.

In the technologies that are normally used for chip production, unavoidable fluctuations normally occur in the manufacturing and process parameters. Thus, for example, the layer thickness of integrated electrical components may fluctuate to a major extent as a function of manufacturing parameters, such as temperatures or dwell times in individual process steps. In consequence, the electrical characteristic variables of the integrated electrical components are likewise subject to tolerances. The electrical capacitance of capacitors is normally subject to tolerances of ±10%, depending on the thickness of the dielectric. Resistors, whose resistance values are dependent not only on the conductance parameters, but also on the layer thickness of the dielectric, are normally subject to tolerances of ±15%. In consequence, all the parameters of circuits that depend on resistance or capacitance values are likewise subject to manufacturing fluctuations.

Fully integrated radio-frequency receivers may be integrated on a single chip. A chip such as this has a large number of integrated components, which are subject to tolerances. Considered in absolute form, the parameters of the integrated components are admittedly subject to major fluctuations, but the tolerances between the components that are integrated on the same chip are very small, since these are subject to the same manufacturing parameters during manufacture.

In radio-frequency receivers, numerous integrated components, such as active filters, demodulators, mixers etc. are characterized by characteristic frequencies. For example, the cut-off frequency of a low-pass filter or the mid-frequency of a bandpass filter depend on time constants that are formed by the product of a resistance value and a capacitance value, and in consequence, are subject to tolerances. Since the characteristic frequencies in radio-frequency receivers may have only tolerances within narrow limits, the requirements for the accuracy of the capacitance values of the capacitors and for the resistance values of the resistors are very stringent.

Normally, the tolerances of the resistors are corrected by comparing a chip-internal resistance with an external resistance. Depending on the discrepancy between the actual resistance value and a nominal value, resistors or capacitors which are already integrated on the chip are then connected in order to correct, as far as possible, for discrepancies between the product of the resistance and the capacitance value and a nominal value. The described principle has the disadvantage that the discrepancies between the capacitance values and nominal values cannot be detected, and in consequence, cannot be corrected either. The compensation for the discrepancies between the product of the resistance value and capacitance value and the nominal value may in consequence be inadequate.

SUMMARY OF THE INVENTION

It is accordingly an object of the invention to provide a circuit configuration for tolerance correction which overcomes the above-mentioned disadvantages of the prior art apparatus and methods of this general type.

In particular, it is an object of the invention to provide a circuit configuration for tolerance correction for integrated resistors and capacitances, in which the discrepancies in both the capacitance value and in the resistance value can be detected.

With the foregoing and other objects in view there is provided, in accordance with the invention, a circuit configuration for tolerance correction. The circuit configuration includes: a frequency demodulator having an input and an output for providing an output signal; and a detector connected to the output of the frequency modulator for determining a frequency error of the frequency demodulator. The frequency demodulator includes at least one variable component, each of which can be a variable resistor or a variable capacitor. The detector is connected to the frequency modulator in order to adjust the variable component as a function of the frequency error.

For the sake of simplicity, the frequency demodulator is referred to in the following text as a demodulator.

The invention is based on the principle of connecting a detector to the output of a demodulator so that, when a reference is applied to the input of the demodulator, which has a variable resistor and a variable capacitor, a signal is produced at the output of the demodulator which, in addition to being dependent on the input signal, is also dependent on the resistance and the capacitance. At least one of the resistor and the capacitor is designed such that it can be adjusted. The discrepancy between the output signal and a nominal output signal that is expected when a reference signal is applied can thus be detected in the detector, for example using a window discriminator. Depending on the discrepancy between the output signal and a nominal signal, that is to say depending on any frequency error in the demodulator, the resistance value or the capacitance value, respectively, of the variable resistor or of the variable capacitor can be varied. For example, resistance or capacitance values may be varied by trial and error or by suitable approximation methods until any discrepancy between the output signal from the demodulator and the desired nominal signal is zero, or is a minimum. It is thus possible to correct the tolerances of capacitors and resistors that are subject to tolerances.

The described configuration has the advantage that, by detecting those effects of discrepancies in the resistance or capacitance values on RC time constants and associated characteristic frequencies, such as mid-frequencies or cut-off frequencies, which are relevant during normal operation, it is possible to correct manufacturing tolerances very accurately.

The corrections in the resistance values or capacitance values can also be used to correct other components, without having to measure them separately. This is because the tolerances of components that have been subjected to the same manufacturing parameters, that is to say those that are integrated on the same chip, for example, have only very minor discrepancies between one another. If, by way of example, the value of a resistor were increased by 10% with the described tolerance correction, in order to compensate for its tolerance, then an increase in the resistance values of all of the other resistors on the same chip by 10% would likewise compensate for their tolerances.

Resistance and capacitance values can be corrected in one advantageous refinement of the present invention. For this purpose, the resistance and the capacitance are designed such that they can be adjusted.

In one advantageous embodiment of the present invention, the demodulator is a frequency demodulator, which associates the frequency of a signal applied to the input with a voltage that can be tapped off at the output. By way of example, a quadri-correlator has a mid-frequency. This mid-frequency may differ from a nominal mid-frequency by a time constant, which is associated with the mid-frequency and is proportional to a product of a resistance and a capacitance, differing from a nominal value. If a signal at the nominal mid-frequency of the quadri-correlator, which may differ from the actual mid-frequency of the quadri-correlator, is fed to its input, then an output signal which may have a discrepancy from a nominal value will be produced at the output of the quadri-correlator. This error is dependent on the product of the resistance value and capacitance value, and it is thus possible to deduce the tolerances of the resistance value and the capacitance value. The successive approximation method (weighing method), for example, can be used by the detector to correct for the discrepancy between the mid-frequency and a nominal mid-frequency. To do this, the discrepancy between the output voltage and a nominal voltage is evaluated, and resistors and capacitors can be adjusted as a function of this until the discrepancy between the output voltage and a nominal value disappears, or is at least reduced.

It may, of course, be sufficient to adjust only the resistance value or the capacitance value in order to achieve the desired success. That is to say, the discrepancy between the output voltage and a nominal value is reduced or is caused to disappear.

It is now possible to use the correction values obtained for the resistance value or the capacitance value, or both, to correct the tolerances in further components that may be arranged on the same chip as the demodulator.

In a further advantageous embodiment of the present invention, a frequency generator for producing a reference frequency is connected to the input of the demodulator. This frequency generator can produce the nominal mid-frequency of a quadri-correlator or some other characteristic frequency in a demodulator, and supply this to the demodulator input.

In a further advantageous embodiment of the present invention, the demodulator has a nominal mid-frequency which is the same as the reference frequency of the frequency generator.

In a further advantageous embodiment of the present invention, the detector can be supplied with a nominal voltage for comparison with the output voltage. This nominal voltage may be produced externally, that is to say outside the detector, for example, by using a reference voltage, or may be produced internally in the detector.

In a further advantageous embodiment of the present invention, the nominal voltage is 0 volts. In the case of quadri-correlators, by way of example, the output voltage is 0 volts when the mid-frequency of the demodulator is applied to the input.

In a further advantageous embodiment of the present invention, the demodulator has further capacitors that can be connected to the capacitor, or has further resistors that can be connected to the resistor. This makes it possible to adjust the resistance or capacitance in the demodulator. It may be possible to connect the further resistors in parallel or in series with the resistor, and the further capacitors can be connected in parallel or in series with the capacitor. The resistance or capacitance value steps of the further resistors and further capacitors can be implemented as a function of the approximation method that is used and of the discrepancies that normally occur from the nominal values.

In a further advantageous embodiment of the present invention, the demodulator is arranged in an intermediate-frequency path of a radio-frequency receiver. Particularly in the case of large-scale integrated receivers for use in mobile radio, for example, in mobile telephones or cordless telephones that are subject to stringent requirements with regard to weight, space requirement and power consumption, the compensation for manufacturing tolerances of integrated components is of major importance. A switch may be connected to the input of the demodulator, in order to switch the demodulator input from a user signal, which can be supplied during normal operation, to a reference signal at a reference frequency, which can be supplied in an adjustment mode in order to adjust the resistors and capacitors. In a receiver with a low intermediate frequency, which may be between 0 and several Megahertz, and for high data rates of, for example, 1 Megabit per second, an intermediate-frequency path generally has an I path and a Q path for the quadrature components. In this case, the polyphase filter which is normally provided for channel filtering and is connected upstream of the demodulator can process a reference signal (which can be supplied to the input of the polyphase filter) in the adjustment mode such that a signal for driving the downstream demodulator in the correct phase is produced at the output of the polyphase filter. This may be done by providing a switch that may be arranged in the I path or in the Q path. During normal operation, the polyphase filter is used to filter out mirror-image frequencies.

The reference frequency for supplying to the demodulator input may, in one advantageous embodiment of the present invention, be divided down from the receiver reference oscillator frequency, which is normally provided in any case. To do this, the radio-frequency receiver has a reference oscillator, which is followed by a divider that is connected to the demodulator input.

Other features which are considered as characteristic for the invention are set forth in the appended claims.

Although the invention is illustrated and described herein as embodied in a circuit configuration for tolerance correction in a frequency demodulator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block circuit diagram of a circuit configuration for tolerance correction;

FIG. 2 is a block circuit diagram of the circuit configuration shown in FIG. 1, but specifically constructed in a radio-frequency receiver;

FIG. 3 is a further block circuit diagram of the circuit configuration shown in FIG. 2; and FIG. 4 is a block circuit diagram of the circuit configuration shown in FIG. 2, but constructed in an RF receiver having I paths and Q paths.

DESCRIPTION OF THE PREFERRED EMBODIMENTS

Referring now to the figures of the drawing in detail and first, particularly, to FIG. 1 thereof, there is shown a demodulator DEM, which is connected upstream of a reference generator REF and is connected downstream of a detector DET.

The demodulator DEM has a variable resistor R and a variable capacitor C, which may be subject to tolerances. In consequence, the RC product RC of the resistance value R and capacitance value C is also subject to tolerances. A reference frequency F, which can be supplied to the input of the demodulator DEM, can be produced in the reference frequency generator REF. A voltage U which is provided at the output of the demodulator DEM can be supplied to a detector DET, where it can be compared with a nominal voltage S, which may likewise be supplied to the detector DET. The nominal voltage S may be 0 volts. The resistor R and the capacitor C in the demodulator are adjusted as a function of the discrepancy between the nominal voltage S and the voltage U, which can be tapped off at the output of the demodulator DEM when the reference frequency F is applied to the input of the demodulator DEM.

The present principle has the advantage that it allows tolerances in the resistance and capacitance values to be corrected, thus making it possible to correct all the circuit parameters that are dependent on the product of a resistance value and capacitance value, for example characteristic frequencies such as mid-frequencies or cut-off frequencies, with regard to discrepancies from nominal values.

FIG. 2 shows an exemplary embodiment of the present invention as shown in FIG. 1 in a radio-frequency receiver. This has a front end FR, to which an antenna A is connected, and an intermediate-frequency path whose intermediate frequency is IF. The front end FR is followed by a demodulator DEM, and by a baseband module BB. During normal operation, the demodulator DEM can be supplied with a user signal, which is input at the antenna A and is processed in the front end FR, and which may be demodulated in the demodulator DEM and supplied to the baseband module BB. In an adjustment mode, which may precede a user mode or normal operation, switching takes place between a reference signal and an intermediate-frequency signal, which can be supplied to the input, by providing a changeover switch or by the capability to switch off the supply voltage of the respective upstream front end FR or frequency generator REF block.

FIG. 2 shows that the described principle of RC tolerance correction can be implemented in a radio-frequency receiver with little complexity and with only a small number of additional components, making it possible to compensate not only for discrepancies between a resistance value and a nominal value, but also between a capacitance and a nominal value.

FIG. 3 shows an exemplary embodiment of the invention as shown in FIG. 2, in which the reference frequency F can be tapped off from a divider DIV, which is connected to a reference oscillator XO. A reference oscillator frequency XF can be tapped off from the reference oscillator XO. The reference frequency F may thus be divided down from a system clock at the reference oscillator frequency XF in the presence of a low intermediate frequency which may, for example, be one Megahertz. A changeover switch SW is connected upstream of the demodulator DEM, in order to switch between the reference frequency F and the user signal at the intermediate-frequency level IF. A channel filter KF is arranged between the front end FR and the changeover switch SW and is used to filter out the mirror-image frequencies that normally occur in superheterodyn receivers. Tapping off the reference frequency from a system clock has the advantage that the modifications that are required for RC tolerance correction in a receiver circuit are minor and can be implemented easily.

As a modification to the circuit configuration shown in FIG. 3, the intermediate-frequency level as shown in FIG. 4 is subdivided into two paths for the quadrature components I, Q. The divider DIV shown in FIG. 3 is arranged in FIG. 4 at a switch SW in the I path between the front end FR and the channel filter KF. One important factor in this case is the configuration of the switch SW on the input side of the channel filter KF. This is because the channel filter KF, which is used for filtering mirror-image frequencies during normal operation, can at the same time be used in an adjustment mode for driving the demodulator DEM with the reference frequency F in the correct phase. The channel filter KF may be a polyphase filter.

We claim:

1. A circuit configuration for tolerance correction, comprising:

a frequency demodulator having a reference input, said frequency demodulator including a resistor and a capacitor and at least one of said resistor and said capacitor being variable, said frequency demodulator having an output for providing an output signal, the output signal being dependent on a reference input signal at the reference input of said frequency demodulator and on said resistor and said capacitor; and a detector connected to said output of said frequency demodulator for determining a frequency error of said frequency demodulator, said detector connected to said frequency demodulator in order to adjust said variable one of said resistor and said capacitor as a function of said frequency error.

2. The circuit configuration according to claim 1, wherein:

said frequency demodulator includes said variable resistor and said variable capacitor; and said detector is connected to said frequency demodulator in order to adjust said variable capacitor and said variable resistor.

3. The circuit configuration according to claim 1, wherein:

said reference input of said frequency demodulator is for receiving said reference input signal having a frequency;

said frequency demodulator is constructed to associate said frequency of said reference input signal with said output signal of said frequency demodulator; and said output signal of said frequency demodulator is a voltage.

4. The circuit configuration according to claim 3, wherein:

said detector is constructed for receiving a nominal voltage and for comparing said nominal voltage with said output signal of said frequency demodulator for determining said frequency error; and said output signal of said frequency demodulator is a voltage.

5. The circuit configuration according to claim 3, comprising:

a frequency generator for producing the reference input signal having a reference frequency;

said frequency generator being connected to said frequency demodulator to supply said reference input signal to said input of said frequency demodulator.

6. The circuit configuration according to claim 5, wherein:

said detector is constructed for receiving a nominal voltage and for comparing said nominal voltage with said output signal of said frequency demodulator for determining said frequency error; and said output signal of said frequency demodulator is a voltage.

7. The circuit configuration according to claim 5, wherein said frequency demodulator has a nominal mid-frequency equal to said reference frequency.

8. The circuit configuration according to claim 7, wherein:

said detector is constructed for receiving a nominal voltage and for comparing said nominal voltage with said output signal of said frequency demodulator for determining said frequency error; and said output signal of said frequency demodulator is a voltage.

9. The circuit configuration according to claim 3, wherein:

said detector is constructed for receiving a nominal voltage and for comparing said nominal voltage with said output signal of said frequency demodulator for determining said frequency error;

said output signal of said frequency demodulator is a voltage; and said nominal voltage is 0 volts.

10. The circuit configuration according to claim 3, comprising:

a frequency generator for producing the reference input signal having a reference frequency, said frequency generator connected to said frequency generator to supply said reference input signal to said input of said frequency demodulator; and a channel filter connected upstream of said frequency demodulator, said channel filter being supplied with said reference input signal.

11. The circuit configuration according to claim 1, comprising:

at least one further functional component connected to said detector;

said further functional component including a variable resistor that can be adjusted as a function of a setting of said variable resistor of said frequency demodulator.

12. The circuit configuration according to claim 1, comprising:

at least one further functional component connected to said detector;

said variable component being said variable capacitor; and said further functional component including a variable capacitor that can be adjusted as a function of a setting of said variable capacitor of said frequency demodulator.

13. The circuit configuration according to claim 1, wherein:

said variable component is said variable capacitor; and said frequency demodulator has further capacitors that can be connected to said variable capacitor.

14. The circuit configuration according to claim 1, wherein:

said variable component is said variable resistor; and said frequency demodulator has further resistors that can be connected to said variable resistor.

15. The circuit configuration according to claim 1, wherein said frequency demodulator is configured in an intermediate-frequency path of a radio-frequency receiver.

16. A radio-frequency receiver, comprising:

a reference oscillator;

a divider following said reference oscillator; and an intermediate-frequency path;

said an intermediate-frequency path including a circuit configuration for tolerance correction, the circuit configuration including:

a frequency demodulator having an input, said frequency demodulator including a resistor and a capacitor and at least one of said resistor and said capacitor being variable, said frequency demodulator having an output for providing an output signal, a detector being connected to said output of said frequency modulator for determining a frequency error of said frequency demodulator, said detector being connected to said frequency demodulator in order to adjust said variable one of said resistor and said capacitor as a function of said frequency error, said input of said frequency demodulator for receiving a reference signal having a reference frequency, said frequency demodulator constructed to associate said frequency of said input signal with said output signal of said frequency demodulator, and said output signal of said frequency demodulator being a voltage, and a frequency generator for producing said reference signal having said reference frequency;

said frequency generator being connected to said frequency demodulator to supply said reference signal to said input of said frequency demodulator;

said divider being connected to said input of said frequency demodulator.

* * * * *